United States Patent
Hackl

(10) Patent No.: US 11,705,715 B2
(45) Date of Patent: Jul. 18, 2023

(54) METHOD, ELECTRICAL CIRCUIT ARRANGEMENTS AND INSULATION MONITORING DEVICES FOR AN INTERFERENCE-RESISTANT INSULATION MONITORING OF AN UNGROUNDED POWER SUPPLY SYSTEM HAVING A CONVERTER

(71) Applicant: Bender Gmbh & Co. KG, Gruenberg (DE)

(72) Inventor: Dieter Hackl, Fernwald (DE)

(73) Assignee: Bender Gmbh & Co. KG, Gruenberg (DE)

( * ) Notice: Subject to any disclaimer, the term of this patent is extended or adjusted under 35 U.S.C. 154(b) by 1054 days.

(21) Appl. No.: 16/030,918

(22) Filed: Jul. 10, 2018

(65) Prior Publication Data

US 2019/0020187 A1 Jan. 17, 2019

(30) Foreign Application Priority Data

Jul. 11, 2017 (DE) ..................... 10 2017 211 845.8

(51) Int. Cl.
*H02H 3/17* (2006.01)
*G01R 27/18* (2006.01)

(52) U.S. Cl.
CPC ............... *H02H 3/17* (2013.01); *G01R 27/18* (2013.01)

(58) Field of Classification Search
CPC .. H02H 7/10–12; H02H 7/122; H02H 7/1222; H02M 2001/0016–0022
See application file for complete search history.

(56) References Cited

U.S. PATENT DOCUMENTS

| 4,935,861 | A | * | 6/1990 | Johnson, Jr. | ............ | H02J 9/062 307/46 |
| 2012/0014020 | A1 | * | 1/2012 | Lehmann | ............... | G01R 31/50 361/42 |
| 2014/0293489 | A1 | * | 10/2014 | Zhu | ........................ | H02H 7/10 361/18 |

(Continued)

FOREIGN PATENT DOCUMENTS

| CN | 1707931 A | 12/2005 |
| CN | 106066450 A | 11/2016 |

(Continued)

*Primary Examiner* — Peter M Novak
(74) *Attorney, Agent, or Firm* — Dickinson Wright PLLC; Andrew D. Dorisio

(57) ABSTRACT

The invention relates to a method, electrical circuit arrangements and insulation monitoring devices for an interference-resistant insulation monitoring of an ungrounded power supply system having a converter.

Figure 1:
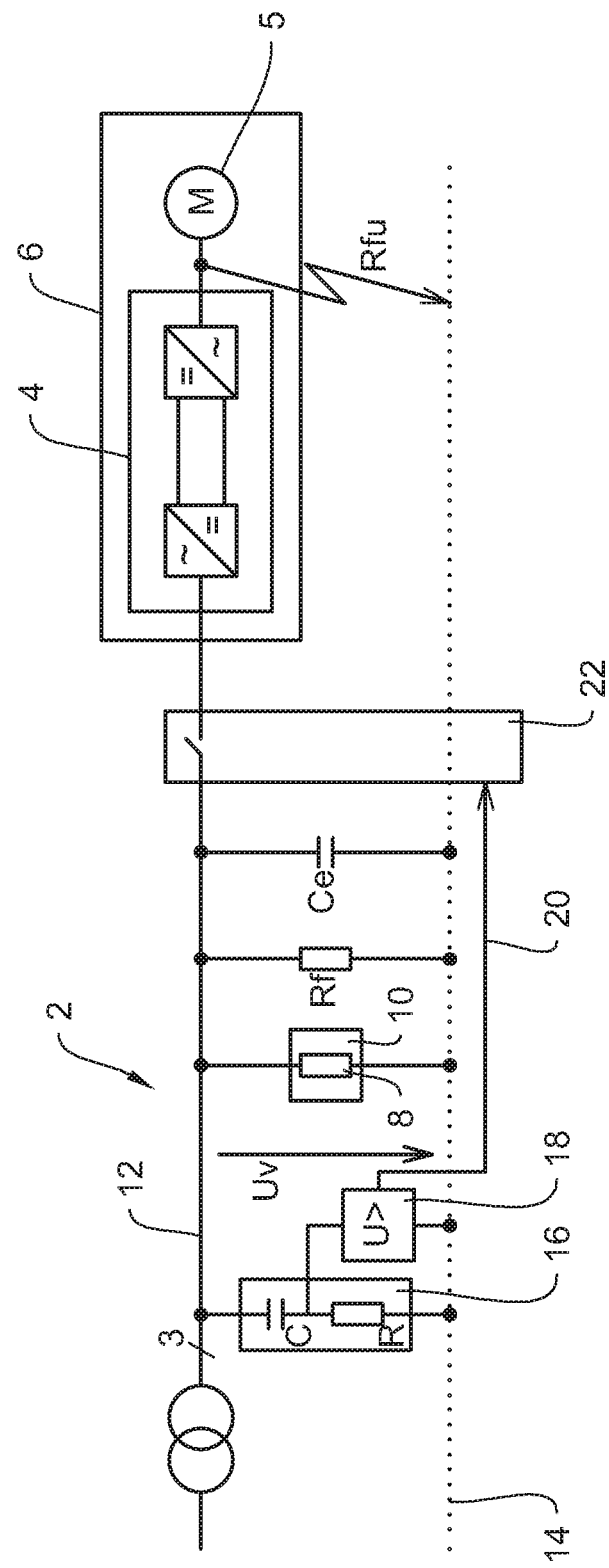

Switching-frequent interfering signals, which are caused by operating the converter, are identified and assessed in a measured displacement voltage independently of the detection of a measuring signal in order to derive a switching (off) signal if required.

Complementary thereto, an interfering resistance with respect to low-frequency interfering portions generated by the converter is attained by these low-frequency interfering portions being generated from a replica of a pulse width modulation signal of the converter and being suppressed sufficiently via subtraction that a monitoring without gaps (frequency) of the insulation resistance becomes possible.

16 Claims, 2 Drawing Sheets

(56) References Cited

U.S. PATENT DOCUMENTS

2015/0257222 A1\* 9/2015 Siessegger ............. H05B 45/39
315/186

FOREIGN PATENT DOCUMENTS

| CN | 208902796 U | 5/2019 |
| --- | --- | --- |
| DE | 102010030129 A1 | 12/2011 |
| DE | 102015208725 B3 | 9/2016 |
| EP | 2219041 A1 | 8/2010 |
| EP | 2230522 A1 | 9/2010 |
| EP | 2490032 A2 | 8/2012 |

\* cited by examiner

METHOD, ELECTRICAL CIRCUIT ARRANGEMENTS AND INSULATION MONITORING DEVICES FOR AN INTERFERENCE-RESISTANT INSULATION MONITORING OF AN UNGROUNDED POWER SUPPLY SYSTEM HAVING A CONVERTER

This application incorporates by reference the disclosure of German Patent Application no. 10 2017 211 845.8, filed Jul. 11, 2017.

TECHNICAL FIELD

The invention relates to a method and electrical circuit arrangements for an interference-resistant insulation monitoring of an ungrounded power supply system having a converter (frequency converter).

Furthermore, the invention relates to insulation monitoring devices having the proposed electrical circuit arrangements.

BACKGROUND

For supplying electric operating means, the network configuration of an ungrounded (IT) power supply system (French: Isolé Terre) is used to meet higher requirements to operational, fire and contact safety. In this type of power supply system, all active parts of the supplying network configuration are separated from the ground potential.

Via the inherent safety of the ungrounded power supply system with respect to dangerous contact voltages, a power supply of the consumers connected to the ungrounded power supply system can be maintained even if a first insulation fault arises.

The electrical resistance of active conductors of the power supply system to ground (insulation resistance —in the event of a fault also an insulation fault resistance or fault resistance) is therefore constantly monitored since a fault loop could arise via a possible further fault at a different active conductor (second fault). The fault current flowing in this instance could cause the installation to be switched off all the way to an operational standstill in conjunction with an overcurrent protection device.

Generally, the insulation resistance is monitored via an insulation monitoring device (IMD) which actively superimposes a measuring voltage over the power supply system and detects and evaluates a measuring signal corresponding to the insulation resistance.

However, applications exist in the ungrounded power supply system, such as in mining or in power plants, in which the power supply should be switched off as quickly as possible when a first insulation fault occurs. The insulation monitoring device should then identify a first fault as quickly as possible and trigger a switching signal.

Unlike in a grounded power supply system, the demand for a shortest possible switch-off time is not dominated by the goal of preventing the risk of an electric shock (by definition, this risk does not exist in the ungrounded power supply system, which is installed according to standard, in the first fault instance) but by the requirements regarding fire safety and installation safety.

In particular in the insulation monitoring in conjunction with high-quality (frequency) converters and controlled drives, short switch-off times in the range of only a few tens of seconds would be theoretically possible when using an active insulation monitoring since the network leakage capacities often have sufficiently small values in these drives.

In practice, however, these switch-off times cannot be achieved in many converter applications since low-frequency displacement voltages, i.e. voltages between an active conductor and ground, are generated having an amplitude specifically via the converter drive (electric motor controlled by a converter) due to the application, said displacement voltages often exceeding the amplitude of the measuring voltage applied by the insulation monitoring device many times over and thus possibly sensitively interfering with the detected measuring signal.

If moreover the frequency of the low-frequency displacement voltage portions is close to the (basic) frequency (measuring frequency) of the applied and specially timed measuring voltage, a monitoring in this operational state therefore would not be possible.

All manufacturers make allowances for the interfering influence in technical documentations of the insulation monitoring devices with the specification of a (monitoring) gap in the specified frequency range in installations. Thus, the frequency range to be monitored in an insulation monitoring device according to the state of the art can, for example, be specified to the effect that a reliable insulation monitoring is only possible for network voltages "DC and 15 to 460 Hz", ergo a monitoring gap exists between DC (direct current) and 15 Hz.

Owing to the low-frequency interfering portions in the detected measuring signal, evaluating the detected measuring signal is cumbersome and the switch-off times attainable according to the state of the art are significantly higher than the ones demanded in some critical applications (mining, power plants).

Extreme demands to the switch-off times arise in particular when an existing 3AC 50/60 Hz IT system having very large network leakage capacitances is expanded by a high-performance frequency-converter drive, for example. In a ground fault, displacement voltages, which lead to the destruction of operating means not configured therefor in the existing 3AC 50/60 Hz IT system, arise at a motor phase of the controlled converter drive. In these systems, switch-off times of under 100 ms are often demanded.

Besides low-frequency interferences, which require a computationally expensive and time-consuming evaluation of the detected measuring signal and thus impair a quick switching off, interfering portions arise in the range of approximately 10 kHz or more, which are generated by the converter and are switching-frequent, i.e. correspond to the switching frequency of the converter, and make quickly switching off the power supply necessary due to their impairing effect on the operating means.

For insulation monitoring, it is known from the state of the art to choose the measuring voltage portion from the detected measuring signal having interferences via analogous or digital filtering measures.

Generally, sophisticated methods for digital signal processing are used in high-quality insulation monitoring devices in order to suppress interfering components whose frequency is very close to the measuring frequency. The closer the interfering signal frequency is to the measuring frequency, the more computational expense and processing time will be required in order to sufficiently suppress interfering signals.

An approach pursued in grounded power supply systems (as opposed to the ungrounded power supply systems observed here), in which installation parts are to be switched off quickly in the event of a critical fault, consists of using protective devices (RCDs—residual current protective devices) based on differential current.

In applications having high-performance frequency-converter drives, however, large DC portions are to be reckoned with in the fault current in the particularly critical fault event, i.e. the ground fault of a motor phase. Using a type A fault current protective device (for identifying fault alternating currents and pulsing fault direct currents) is therefore not possible most of the time. Corresponding suitable type B fault current protective devices (for identifying fault alternating currents, pulsing fault direct currents and pure fault direct currents) are often not available for high-performance frequency-converter drives.

However, using protective devices based on differential current in ungrounded power supply systems is generally problematic since this type of protective device only works reliably if it is ensured that the differential current transformer of the fault current protective device is actually in the fault loop.

The demand for short measuring and switch-off times, which is provided in specific applications, cannot be met in its entirety according to the state of the art.

SUMMARY

The object of the invention at hand is therefore to indicate a method and a device for an interference-resistant insulation monitoring in an un-grounded power supply system having a converter drive.

In regard to a method, this object is attained by applying a measuring voltage between an active conductor of the power supply system and ground and by detecting a measuring signal driven by the measuring voltage, by detecting a displacement voltage between an active conductor of the power supply system and ground on an input side of the converter, by filtering a switching-frequent signal portion, which is generated by the converter, from the detected displacement voltage, by evaluating the switching-frequent, filtered signal portion, and by triggering a switching signal, should the evaluation of the switching-frequent signal portion yield that the switching-frequent signal portion surmounts a critical amplitude value.

In contrast to the methods which are known from the state of the art and rest upon a selection of the measuring current portion from the detected measuring signal having interferences, the approach according to the invention is based upon identifying and assessing the switching-frequent signal portions, which are generated by the converter, independently of the identification of the measuring signal as well as deriving a switching (off) signal therefrom if required.

By means of a coupling device, a measuring voltage is applied between one or between all (in multiphase ungrounded power supply systems preferably) active conductor(s) of the power supply system and ground. The measuring voltage superposed over the power supply system generates a measuring signal, which is detected in the coupling device and is consulted for determining the insulation resistance of the power supply system and, if required, for switching off faulty installation parts. An unadulterated measuring signal is therefore indispensable.

In the event of a particularly low-impedance, asymmetric ground fault at a motor phase (active conductor) of the converter drive, the converter causes a switching-frequent common mode voltage, which becomes noticeable on the input side of the converter (network side) as a displacement voltage between the affected active conductor of the power supply system and ground and has an amplitude corresponding approximately to the intermediate-circuit voltage of the frequency converter.

If very large network leakage capacitances are available on the network side of the frequency converter in the ungrounded power supply system—the capacitative conductance value being proportional to the capacity and to the frequency—then in particular these switching-frequent portions of the displacement voltage cause a high possibly dangerous current via a ground connection, such as a protective conductor of the connected consumers.

In order to identify the switching-frequent signal portion, the displacement voltage is therefore detected between the affected active conductor of the power supply system and ground on the input side of the converter. In multiphase ungrounded power supply systems, the displacement voltage is preferably detected between all active conductors and ground.

By means of a filter circuit, the switching-frequent signal portion is initially filtered from the detected displacement voltage(s) and subsequently evaluated. Should the evaluation yield that the switching-frequent signal portion surmounts a critical amplitude value, a switching signal is triggered.

According to the invention, the switching-frequent signal portion is filtered and evaluated such from the detected displacement voltage that power-frequent portions and/or DC portions do not lead to a switching signal being triggered or to the faulty converter drive being switched off in the displacement voltage.

In contrast to the described fault instance at a motor phase of the converter drive ("behind" the converter), a first fault leads to significantly smaller currents on the power frequency side of the ungrounded power supply system ("in front of" the converter) or in a DC voltage circuit of the converter even in very large network leakage capacitances. When adhering to the specifications from standards for establishing electric installations, these currents do not destroy installation parts. A quick switching off is not required in this instance, as would be generally expected in an ungrounded power supply system.

Preferably, the converter is separated from the power supply system should the switching signal be triggered.

According to the invention, an interfering resistance is attained in the insulation monitoring by switching-frequent signal portions, which could falsify the measuring signal detected for monitoring the insulation resistance, being identified and evaluated independently of the detected measuring signal.

The switching-frequent interfering signal portions generated by the converter and found in the displacement voltage are filtered and assessed, a switching signal being triggered if a critical amplitude value of this switching-frequent signal portion is surmounted.

The switching signal can be used for quickly and selectively switching off the frequency-converter drive. Thus, selectively and quickly switching off a faulty converter drive is possible when an asymmetric ground fault arises.

Further parts of the power supply system need not be switched off "in front of" the converter (on the network side). For all other connected consumers (excluding the faulty converter portion), the advantages of the ungrounded power supply system continue to be valid—their operation can be continued without interferences.

Complementary to the described method, the object of the invention is further attained by applying a measuring voltage between an active conductor of the power supply system and ground, and by detecting a measuring signal driven by the measuring voltage, by replicating a pulse width modulation signal of the converter, by assessing the replicated pulse width modulation signal using filter characteristics corresponding to a filtering of the detected measuring signal in order to obtain a low-frequency interfering signal, and by subtracting the low-frequency interfering signal from the detected measuring signal.

Using this approach, an interfering resistance is attained in the insulation monitoring with respect to interfering portions generated by the converter by these low-frequency interfering portions being sufficiently suppressed that a monitoring of the insulation resistance becomes possible without gaps in frequency. Hence, even symmetric faults can be quickly and accurately detected in low-frequency interferences.

In contrast to the switching-frequent interfering portions described above, low-frequency interfering portions arise in the displacement voltage of an ungrounded power supply system having a converter drive via the pulse width modulation (PWM) used in the converter for generating control signals. These interfering portions can have amplitudes in the range of the intermediate-circuit voltage of the frequency converter.

Instead of the slowly settling analogous and/or digital filters known from the state of the art for eliminating the switching-frequent interfering portions, system knowledge on the frequency converter causing the low-frequency interfering portions is used for replicating the pulse width modulation signal (PWM signal). The frequency and the duty factor of the pulse width modulation signal or the amplitude of the intermediate-circuit direct voltage can be used as accessible internal parameters of the converter, for example.

The pulse width modulation signal of the frequency converter is reconstructed from the available system knowledge and assessed using the same filter characteristics corresponding to a filtering of the detected measuring signal. In order to obtain a low-frequency interfering signal, precisely those filter algorithms are thus used on the replicated pulse width modulation signal which the measuring signal detected for insulation monitoring also passes through in an insulation monitoring device.

The thus obtained low-frequency interfering signal is then subtracted from the detected measuring signal, which contains a usable portion (due to the supplied measuring voltage) as well as an interfering portion caused by the converter drive, in order to obtain a measuring signal free of the low-frequency interference for determining the insulation resistance.

If, in addition thereto, the modulation type (e.g. block or sine commutation) of the frequency converter is known, the PWM signal of the frequency converter can thus be replicated without knowing further signal portions such as network frequency or measuring signal.

The assessment of the replicated pulse width modulation signal using the same filter algorithms, which are used on the detected measuring signal in an insulation monitoring device (preferably a filtering having low-pass characteristics), extracts the desired low-frequency interfering portions which the frequency converter causes.

If this low-frequency interfering signal is subtracted from the detected measuring signal in the insulation monitoring device, an interference can thus be sufficiently suppressed. In this manner, a standardized, quickly functioning insulation monitoring, which is moreover resistant to interferences in the low-frequency range, is possible in all operating states of the converter in an ungrounded power supply system having a converter, without a monitoring gap arising in low-frequency ranges.

By not selecting the low-frequency interference from the detected measuring signal via cumbersome and/or slow filtering algorithms, it becomes possible for the interference suppression to function noticeably faster—even in those instances in which the frequencies of the interfering signal and the measuring signal lie close together.

In another embodiment, a frequency and a duty factor of the pulse width modulation signal are provided by the converter via a digital interface or alternatively can be computed using signal processing methods.

The frequency and the duty factor of the pulse width modulation signal can be provided directly by the frequency converter via a digital interface, for example, or via very fast control-technological methods from communications engineering (e.g. PLL circuits).

Furthermore, an amplitude of the pulse width modulation signal is directly predetermined or metrologically determined as an amplitude of an intermediate-circuit direct voltage of the converter.

Preferably, the amplitude of the pulse width modulation signal is determined metrologically by measuring a direct voltage at the intermediate circuit of the converter or by measuring a conductor voltage using a correction factor.

The metrological determination can be yielded by measuring a direct voltage at the intermediate circuit of the converter or by measuring the phase-phase voltage while using a known correction factor. Commonly, the relation $U_{zwk} = (1.32 \ldots 1.4) U_n$ applies, having the intermediate-circuit direct voltage $U_{zwk}$, the network voltage $U_n$ and the correction factor between 1.32 and 1.4.

With respect to a device, the object of the invention is attained by an electrical circuit arrangement for a interference-resistant insulation monitoring of an ungrounded power supply system having a converter; having a coupling device for applying a measuring voltage between an active conductor of the power supply system and ground and for detecting a measuring signal driven by the measuring voltage; having a detection device for detecting a displacement voltage between an active conductor of the power supply system and ground on an input side of the converter and for filtering a switching-frequent signal portion, which is generated by the converter, from the detected displacement voltage; and having an evaluation circuit for evaluating the filtered switching-frequent signal portion and for triggering a switching signal, should the evaluation of the switching-frequent signal portion yield that the switching-frequent signal portion surmounts a critical amplitude value.

For carrying out the method according to claim 1 of the invention, the electrical circuit arrangement according to the invention comprises the following function blocks as essential components: a coupling device for applying the measuring voltage; a detection device for detecting the displacement voltage and for filtering the switching-frequent signal portion generated by the converter; and an evaluation circuit for evaluating the filtered switching-frequent signal portion and for triggering a switching signal.

In another embodiment, the detection device is realized as an analogous RC high-pass filter circuit.

In an embodiment alternative to the analogous RC high-pass filter circuit, the detection device for filtering the switching-frequent signal portion comprises a digital signal-processing circuit.

This digital filter circuit can be integrated advantageously into an insulation monitoring device in conjunction with the evaluation circuit.

Furthermore, the electrical circuit arrangement comprises a separating device which is connected to the evaluation circuit via a signal line for forwarding the switching signal.

Should a switching signal be triggered by the evaluation circuit and be forwarded to the separating device via the signal line, the converter is separated from the power supply network.

Advantageously, the insulation monitoring device for monitoring an insulation resistance in an ungrounded power supply system having a converter comprises an electrical circuit arrangement according to the invention for an interference-resistant insulation monitoring, which extracts and evaluates the switching-frequent signal portion generated by the converter. The standardized insulation monitoring device required for insulation monitoring can be configured to be less sensitive to switching-frequent interfering portions via an enhancement with the electrical circuit arrangement according to the invention and be provided with a switching-off function.

Complementary to the electrical circuit arrangement described above having the filtering of a switching-frequent signal portion generated by the converter, the object of the invention is further attained by an electrical circuit arrangement having a coupling device for applying a measuring voltage between an active conductor of the power supply system and ground and for detecting a measuring signal driven by the measuring voltage; having a reconstruction unit for replicating a pulse width modulation signal of the converter; having an assessment circuit for assessing the replicated pulse width modulation signal, said assessment circuit having filtering characteristics corresponding to a filtering of the detected measuring signal in order to obtain a low-frequency interfering signal; and having a subtraction circuit for subtracting the low-frequency interfering signal from the detected measuring signal.

In order to carry out the method according to claim 3 of the invention, the electrical circuit arrangement according to the invention comprises the following as essential function blocks: a coupling device for applying a measuring voltage; a reconstruction unit for replicating a pulse width modulation signal; an assessment circuit for assessing the replicated pulse width modulation signal; and a subtraction circuit for subtracting the low-frequency interfering signal from the detected measuring signal.

Complementary to the circuit arrangement described above, which evaluates the switching-frequent interfering portions and considers them as switching-off criterion if required, the pulse width modulation signal of the converter is replicated using this circuit arrangement in the reconstruction unit and is low-pass filtered in the assessment circuit. The thus modulated signal corresponds to the low-frequency interfering signal generated by the converter and is subtracted from the detected measuring signal in the subtraction circuit in order to obtain a measuring signal free of low-frequency interference portions.

In another embodiment, the electrical circuit arrangement has a digital interface, via which a frequency and a duty factor of the pulse width modulation signal is provided by the converter.

Alternatively, the electrical circuit arrangement can have a computation unit for computing a frequency and a duty factor of the pulse width modulation signal using signal-processing methods.

For monitoring an insulation resistance in an ungrounded power supply system having a converter, the insulation monitoring device advantageously has an electrical circuit arrangement according to the invention for an interference-resistant insulation monitoring, which replicates the pulse width modulation signal of the converter and eliminates the low-frequency interfering signal obtained therefrom from the detected measuring signal.

Through this enhancement of the standardly required insulation monitoring device, the insulation monitoring can be reliably carried out even when low-frequency interfering signals arise.

BRIEF DESCRIPTION OF THE DRAWING FIGURES

Further advantageous embodiments are derived from the following description and the drawings, which describe preferred embodiments of the invention by means of examples. In the following, FIG. 1 illustrates an embodiment of a circuit arrangement according to the invention having an evaluation of a switching-frequent signal portion, and FIG. 2 illustrates an embodiment of the circuit arrangement according to the invention having a replica of a pulse width modulation signal.

DETAILED DESCRIPTION

Figure 2:
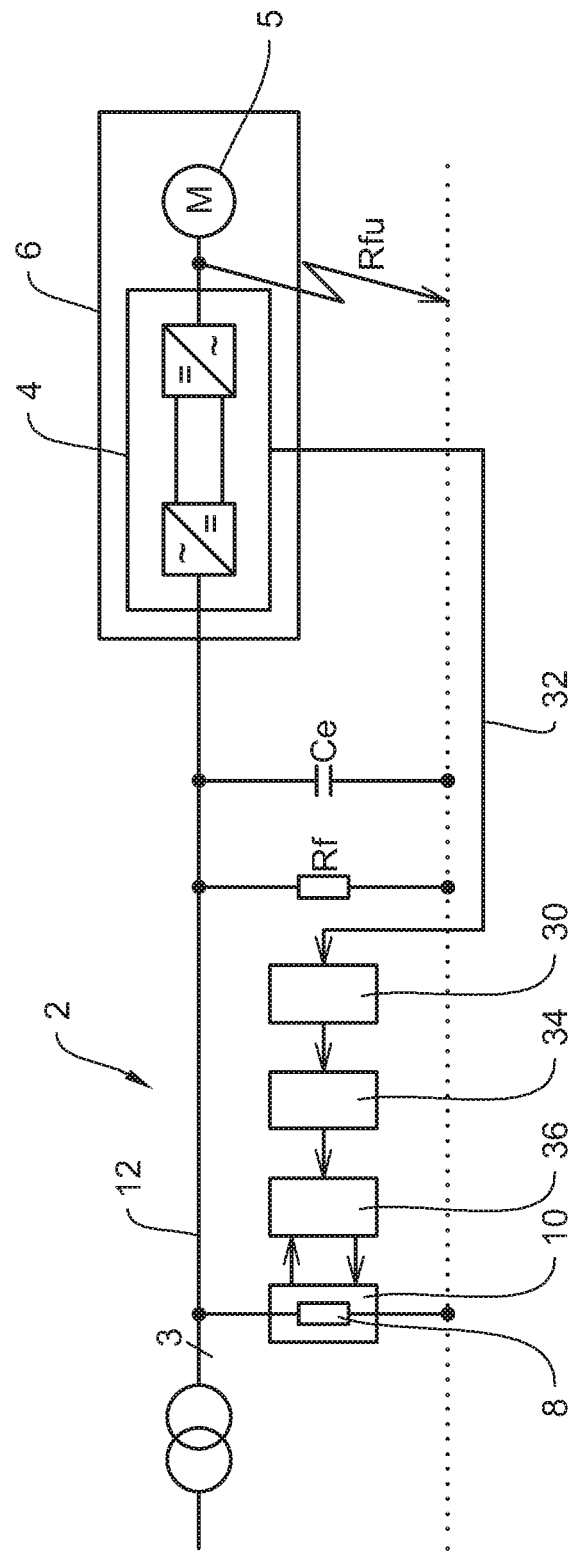

In a functional block diagram, FIG. 1 illustrates a first circuit arrangement according to the invention for an interference-resistant insulation monitoring of an ungrounded power supply system 2 having a converter 4. The converter 4 controls an electric motor 5 and forms a converter drive 6 in conjunction therewith.

This circuit arrangement according to the invention is based on the evaluation of a switching-frequent signal portion in order to separate the converter drive 6 from the power supply system 2 when an insulation fault Rfu arises, e.g. a ground fault at the electric motor 5 (drive unit) switched downstream of the converter 4.

The ungrounded power supply system 2 is configured having three phases in this instance and is characterized by the leakage resistance (insulation resistance) Rf and the leakage capacitance Ce.

The circuit arrangement according to the invention has a coupling device 8 which is preferably arranged in an insulation monitoring device 10. The coupling device 8 applies a measuring voltage between at least one active conductor 12 of the power supply system 2 and ground 14 and detects a measuring signal driven by the measuring voltage.

Furthermore, the circuit arrangement according to the invention has a detection device 16 in order to detect a displacement voltage Uv between the active conductor 12 of the power supply system 2 and ground 14; in multiphase ungrounded power supply systems 2, the displacement voltages Uv are detected between all active conductors 12 and ground 14. Switching-frequent signal portions generated by the converter due to the ground fault Rfu are filtered from the displacement voltage(s) Uv in the detection device 16.

The detection unit 16 is illustrated in an embodiment as an analogous RC high-pass circuit; alternatively, an implementation as a digital filter structure is also possible.

The high-frequency or switching-frequent signal portions detected via the resistance R of the detection unit 16 is supplied to an evaluation circuit 18 which triggers a switching signal, should the evaluation of the switching-frequent signal portion yield that this signal portion surmounts a critical amplitude value. The evaluation circuit 18 can be realized as a maximum voltage relay.

The switching signal is forwarded via a signal line 20 to a separating device 22 which separates the faulty converter drive 6 from the power supply system 2.

In FIG. 2, a second circuit arrangement according to the invention for an interference-resistant insulation monitoring of an ungrounded power supply system 2 having a converter 4 is illustrated in a functional block diagram.

This circuit arrangement replicates a pulse width modulation signal of the converter 4 in order to obtain a measuring signal free of resistance in the low-frequency range, preferably between DC and approximately 15 Hz. In older insulation monitoring devices, this low-frequency range can be up to 40 Hz due to the larger monitoring gap DC; newer, high-quality insulation monitoring devices reduce the monitoring gap from DC to below 1 Hz.

In this embodiment, the circuit arrangement comprises a reconstruction unit 30, which replicates the pulse width modulation signal of the converter 4, besides the coupling arrangement 8 arranged in the insulation monitoring device 10. In addition, the reconstruction unit 30 is connected to the converter 4 via a digital interface 32 in order to directly consult internal parameters of the converter such as frequency and duty factor of the pulse width modulation signal so as to replicate the pulse width modulation signal.

The circuit arrangement further comprises an assessment circuit 34 which subjects the replicated pulse width modulation signal to being filtered in order to obtain a low-frequency interfering signal mirroring the interference portions generated by the converter 4 in the fault instance. The filtering characteristics used therefor correspond to those which are used for filtering the detected measuring signal in the insulation monitoring device 10.

In a subtraction circuit 36 arranged downstream of the assessment circuit 34, the low-frequency interfering signal obtained via filtering is subtracted from the detected measuring signal so that the low-frequency interfering portion comprised in the detected measuring signal and the low-frequency interfering portion obtained from the reconstructed pulse width module signal compensate each other, and a measuring signal mostly free of interferences is available in the low-frequency range.

The invention claimed is:

1. A method for an interference-resistant insulation monitoring of an ungrounded power supply system having a converter, comprising the method steps:
    applying a measuring voltage between an active conductor of the power supply system and ground and detecting a measuring signal driven by the measuring voltage,
    detecting a displacement voltage between an active conductor of the power supply system and ground on an input side of the converter,
    filtering a switching-frequent signal portion, which is generated by the converter, from the detected displacement voltage,
    evaluating the filtered, switching-frequent signal portion,
    triggering a switching signal should the evaluation of the switching-frequent signal portion yield that the switching-frequent signal portion surmount a critical amplitude value.

2. The method according to claim 1, characterized by separating the converter from the power supply system should the switching signal be triggered.

3. A method for an interference-resistant insulation monitoring of an ungrounded power supply system having a converter, comprising the method steps:
    applying a measuring voltage between an active conductor of the power supply system and ground and detecting a measuring signal driven by the measuring voltage,
    replicating a pulse width modulation signal of the converter,
    assessing the replicated pulse width modulation signal using filter characteristics corresponding to a filtering of the detected measuring signal in order to obtain a low-frequency interfering signal,
    subtracting the low-frequency interfering signal from the detected measuring signal.

4. The method according to claim 3, characterized in that a frequency and a duty factor of the pulse width modulation signal are provided by the converter via a digital interface.

5. The method according to claim 3, characterized in that a frequency and a duty factor of the pulse width modulation signal are calculated using signal processing methods.

6. The method according to claim 3, characterized in that an amplitude of the pulse width modulation signal is directly predetermined as an amplitude of an intermediary-circuit direct voltage of the converter.

7. The method according to claim 3, characterized in that the amplitude of the pulse width modulation signal is metrologically detected via a direct voltage measurement at the intermediate circuit of the converter or via a conductor voltage measurement having a correction factor.

8. An electrical circuit arrangement for an interference-resistant insulation monitoring of an ungrounded power supply system having a converter, having a coupling device for applying a measuring voltage between an active conductor of the power supply system and ground and for detecting a measuring signal driven by the measuring voltage; having a detection device for detecting a displacement voltage between an active conductor of the power supply system and ground on an input side of the converter and for filtering a switching-frequent signal portion, which is generated by the converter, from the detected displacement voltage; and having an evaluation circuit for evaluating the filtered switching-frequent signal portion and for triggering a switching signal should the evaluation of the switching-frequent signal portion yield that the switching-frequent signal portion surmounts a critical amplitude value.

9. The electrical circuit arrangement according to claim 8, characterized in that the detection device is realized as an analogous RC high-pass filter circuit.

10. The electrical circuit arrangement according to claim 8, characterized in that the detection device for filtering the switching-frequent signal portion comprises a digital signal processing circuit.

11. The electrical circuit arrangement according to claim 8, characterized by a separating device connected to the evaluation circuit via a signal line for forwarding the switching signal.

12. An insulation monitoring device for monitoring an insulation resistance in an ungrounded power supply system having a converter, characterized by an electrical circuit arrangement for an interference-resistant insulation monitoring according to claim 8.

13. An electrical circuit arrangement for an interference-resistant insulation monitoring of an ungrounded power supply system having a converter, having a coupling device for applying a measuring voltage between an active conductor of the power supply system and ground and for detecting a measuring signal driven by the measuring voltage;

having a reconstruction unit for replicating a pulse width modulation signal of the converter; having an assessment circuit for assessing the replicated pulse width modulation signals, said assessment circuit having filter characteristics corresponding to a filtering of the detected measuring signal in order to obtain a low-frequency interfering signal; and having a subtraction circuit for subtracting the low-frequency interfering signal from the detected measuring signal.

14. The electrical circuit arrangement according to claim 13, characterized by a digital interface via which a frequency and a duty factor of the pulse width modulation signal are provided by the converter.

15. The electrical circuit arrangement according to claim 13, characterized by a computing unit for computing a frequency and a duty factor of the pulse width modulation signal using signal processing methods.

16. An insulation monitoring device for monitoring an insulation resistance in an ungrounded power supply system using a converter, characterized by an electrical circuit arrangement for an interference-resistant insulation monitoring according to claim 13.

\* \* \* \* \*